United States Patent
Wirth

(10) Patent No.: US 8,067,783 B2
(45) Date of Patent: Nov. 29, 2011

(54) RADIATION-EMITTING CHIP COMPRISING AT LEAST ONE SEMICONDUCTOR BODY

(75) Inventor: Ralph Wirth, Mintraching (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 141 days.

(21) Appl. No.: 12/527,148

(22) PCT Filed: Jan. 31, 2008

(86) PCT No.: PCT/DE2008/000172
§ 371 (c)(1),
(2), (4) Date: Sep. 1, 2009

(87) PCT Pub. No.: WO2008/101456
PCT Pub. Date: Aug. 28, 2008

(65) Prior Publication Data
US 2010/0038673 A1  Feb. 18, 2010

(30) Foreign Application Priority Data
Feb. 21, 2007  (DE) .......................... 10 2007 008 524

(51) Int. Cl.
*H01L 33/00* (2010.01)
(52) U.S. Cl. .................................. 257/99; 257/E33.064
(58) Field of Classification Search ................... 257/99, 257/E33.064, E33.066, 98, 88
See application file for complete search history.

(56) References Cited

U.S. PATENT DOCUMENTS

| | | | |
|---|---|---|---|
| 6,573,537 B1 | 6/2003 | Steigerwald et al. | |
| 6,710,374 B2 | 3/2004 | Wirth | |
| 6,878,563 B2 | 4/2005 | Bader et al. | |
| 6,995,030 B2 | 2/2006 | Illek et al. | |
| 7,317,211 B2* | 1/2008 | Watanabe et al. | 257/98 |
| 7,595,511 B2* | 9/2009 | Kang | 257/88 |
| 2003/0164503 A1 | 9/2003 | Chen | |
| 2004/0031967 A1 | 2/2004 | Fudeta et al. | |
| 2004/0188791 A1 | 9/2004 | Horng et al. | |
| 2004/0195576 A1 | 10/2004 | Watanabe et al. | |
| 2006/0002442 A1 | 1/2006 | Haberern et al. | |
| 2006/0051937 A1 | 3/2006 | Ploessl et al. | |

(Continued)

FOREIGN PATENT DOCUMENTS

DE     100 17 336 A1    10/2001

(Continued)

OTHER PUBLICATIONS

Schnitzer, I., et al., "30% external quantum efficiency from surface textured, thin-film light-emitting diodes," Applied Physics Letters 63, Oct. 18, 1993, 3 pages.

*Primary Examiner* — Mark Prenty
(74) *Attorney, Agent, or Firm* — Slater & Matsil, L.L.P.

(57) ABSTRACT

A chip includes at least one semiconductor body having a radiation-emitting region, and at least one first contact region which is provided for making electrical contact with the semiconductor body and is spaced apart laterally from the radiation-emitting region. An electrically conductive first contact layer which is transmissive to the emitted radiation and which connects a surface of the semiconductor body, is situated on the radiation exit side of the chip to the first contact region. The surface is free of the radiation-absorbing contact structures.

22 Claims, 3 Drawing Sheets

U.S. PATENT DOCUMENTS

| | | |
|---|---|---|
| 2006/0163601 A1 | 7/2006 | Harle et al. |
| 2007/0023765 A1 | 2/2007 | Thomas et al. |

FOREIGN PATENT DOCUMENTS

| | | |
|---|---|---|
| DE | 100 26 254 A1 | 11/2001 |
| DE | 102 13 701 A1 | 10/2002 |
| DE | 101 62 914 A1 | 7/2003 |
| DE | 103 08 866 A1 | 9/2004 |
| DE | 10 2004 036 962 A1 | 3/2006 |
| JP | 63-244689 A | 10/1988 |
| JP | 09-283801 A | 10/1997 |
| WO | WO 2004/073075 A1 | 8/2004 |
| WO | WO 2005/015647 A1 | 2/2005 |
| WO | WO 2005/099310 A3 | 10/2005 |

* cited by examiner

RADIATION-EMITTING CHIP COMPRISING AT LEAST ONE SEMICONDUCTOR BODY

This patent application is a national phase filing under section 371 of PCT/DE2008/000172, filed Jan. 31, 2008, which claims the priority of German patent application 10 2007 008 524.0, filed Feb. 21, 2007, each of which is incorporated herein by reference in its entirety.

TECHNICAL FIELD

The invention relates to a chip provided for the emission of radiation. In particular, the chip has a wire-free contact-connection on a surface on the radiation exit side.

BACKGROUND

Optoelectronic components, such as light-emitting diodes (LEDs), for example, generally have two opposite contact areas, wherein one of the contact areas is often mounted onto an electrically conductive carrier, for example, onto a region of a chip housing which is provided with a metallization layer.

The electrical contact-connection of the further contact area is conventionally produced by means of a bonding wire. In order to produce an electrically conductive connection between the bonding wire and the chip surface to be contact-connected, a region of the chip surface is provided with a metallic layer, the so-called bonding pad. However, the metal layer has the disadvantage that it is optically non-transparent and part of the light generated in the chip is absorbed thereby. However, reducing the area of the bonding pad is technically possible only to a limited extent and increases the production cost.

In order to reduce the problem of the shading of part of the surface of an optoelectronic component which is provided for coupling out radiation, it is known from Japanese patent publication JP 09283801 A for an electrode arranged on the surface of the semiconductor chip to be contact-connected in wire-free fashion with an electrically conductive transparent layer composed of indium tin oxide (ITO). In this case, the side flanks of the semiconductor chip are electrically insulated from the conductive transparent layer by an insulating layer composed of $SiO_2$.

SUMMARY

In one aspect, the invention specifies a chip in which the problem of the shading of a surface of a semiconductor body which is arranged on the radiation exit side of the chip is reduced further.

A chip according to the invention comprises at least one semiconductor body having a radiation-emitting region, and furthermore at least one first contact region which is provided for making electrical contact with the semiconductor body and is spaced apart laterally from the radiation-emitting region, and additionally an electrically conductive first contact layer, which is transmissive to the emitted radiation and which connects a surface of the semiconductor body which is situated on the radiation exit side of the chip to the first contact region, wherein the surface is free of the radiation-absorbing contact structures.

Preferably, the first contact layer on the radiation exit side is free of the radiation-absorbing contact structures.

In the present case, contact structures should be understood to mean, in particular, metallic contact regions, for example, in the form of contact webs or bonding pads. Accordingly, the first contact layer is not a contact structure. For lack of radiation-absorbing contact structures on the radiation exit side of the chip, the radiation emission which is possible by means of the chip is advantageously increased. Furthermore, a shading bonding wire which typically connects a bonding pad arranged on the surface on the radiation exit side to a connection region can advantageously be dispensed with on the surface on the radiation exit side. This is possible by virtue of the fact that the first contact layer replaces both the bonding pad and the bonding wire. It goes without saying that an electrical connection of the chip by means of a wire connection is not excluded in the case of the present invention. The first contact region can be electrically connected to a voltage source, for example, by means of a bonding wire.

The radiation-emitting region comprises a radiation-generating pn junction. In the simplest case, the pn junction can be formed by means of a p-conducting and an n-conducting semiconductor layer which directly adjoin one another. Preferably, the actual radiation-generating layer, for instance in the form of a doped or undoped quantum layer, is formed between the p-conducting and the n-conducting active layer. The quantum layer can be shaped as a single quantum well (SQW) structure or multiple quantum well (MQW) structure or else as a quantum wire or quantum dot structure.

In one preferred configuration of the chip, the first contact region is spatially separated from the radiation-emitting region. In particular, neither the radiation-emitting region nor other semiconductor layers extend as far as the first contact region. Should this be the case nonetheless, then the semiconductor layers are preferably severed, for example, by means of a separating joint, at the junction with the first contact region in order to prevent the generation of radiation directly below the first contact region, which may be radiation-absorbing.

Since the first contact region is not arranged in the main beam path of the chip, the first contact region can be formed without particular consideration of optical properties, and therefore principally from the standpoint of comparatively good electrical conductivity or current distribution. Improved radiation emission in conjunction with improved electrical contact-connection can advantageously be obtained in the case of the chip according to the invention.

In accordance with one preferred embodiment, the surface is covered for the most part by the first contact layer. This means that the surface is covered completely or almost completely by the first contact layer, wherein an insulating layer, in particular, can be provided in the case of almost complete covering, the insulating layer being arranged, for example, marginal and if appropriate peripheral on the surface.

In accordance with a particularly preferred embodiment, the first contact layer forms a layer which outwardly delimits the chip in a main emission direction. Preferably, the first contact layer contains a TCO (Transparent Conductive Oxide). The TCO can be applied to the semiconductor body by sputtering or vapor deposition, for example. TCOs are transparent conductive materials, generally metal oxides such as, for example, zinc oxide, tin oxide, cadmium oxide, titanium oxide, indium oxide or indium tin oxide (ITO). Alongside binary metal-oxygen compounds such as, for example, ZnO, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs need not necessarily correspond to a stoichiometric composition and can also be p- or n-doped. This is the case here particularly if a TCO is used for the first contact layer having a first conductivity and for a second contact layer having a second conductivity. By way of example, the TCO of the first contact layer can be p-doped, while the TCO of the second contact layer is n-doped.

In accordance with one preferred development, the first contact region is a bonding pad or contact finger. Particularly preferably, the first contact region contains a metal, for instance Au. The first contact region advantageously has a comparatively high reflectance, which can be in particular 90%. In comparison with a conventional chip in which light beams that start near a bonding pad are absorbed with the probability of approximately 50%, the radiation losses caused by the first contact region are relatively low. The comparatively high reflectance can be achieved in total by the spacing apart of the first contact region from the semiconductor body, by a suitable choice of material and the form of the first contact region, for example, prismatic.

In accordance with a particularly preferred development, the first contact region and the semiconductor body are arranged on a common carrier. The stability of the chip is advantageously increased by means of a carrier, which facilitates handling of the chip, for example.

In one advantageous variant, the chip has a second contact layer, which connects the semiconductor body to a second contact region for making electrical contact with the semiconductor body. The second contact layer likewise enables a wire-free contact-connection of the semiconductor body. The semiconductor body can be connected both mechanically and electrically to the second contact region by means of an electrically conductive adhesive.

The second contact region is preferably applied to the carrier. The second contact region is particularly preferably formed on the carrier before the at least one semiconductor body is mounted on the carrier. The second contact region is expediently formed in metallic fashion. In particular, the second contact region can contain Au, Al, Ag, AuZn. Materials of this type are suitable, inter alia, for an embodiment of the second contact region as a reflection layer.

In accordance with one preferred embodiment, the second contact region is a reflection layer suitable for emitting the impinging radiation in the direction of the main emission direction. The radiation emitted by the chip can therefore be advantageously increased.

In accordance with a further preferred embodiment, the first contact region is disposed downstream of the second contact region in a vertical direction proceeding from the carrier.

The main emission direction and the vertical direction in the present case both denote a direction which runs parallel to a growth direction and in which the semiconductor layers of the semiconductor body are grown.

Preferably, the second contact layer is arranged between the semiconductor body and the second contact region and together with the second contact region forms a mirror. In particular, the second contact layer can be transmissive to the emitted radiation. Radiation which is transmitted by the second contact layer can then be reflected at the reflection layer. By way of example, the second contact layer can contain a TCO. When the same material is used for the first and second contact layers, the semiconductor body can be embedded completely into the material, in particular, TCO.

In order to prevent a short circuit, an insulating layer can be arranged between the first contact region and the second contact region. In addition, the insulating layer is preferably arranged in such a way as to prevent a short circuit between p-conducting and n-conducting regions of the semiconductor body. In this case, part of the insulating layer can be applied on side areas of the semiconductor body. Suitable materials for the insulating layer are silicon nitride or silicon oxide, for example.

In a first variant, the chip has at least one first and one second semiconductor body which are spaced apart laterally and between which a first contact region is arranged. This arrangement is advantageous, in particular, in the case of relatively large chips, preferably having an edge length of greater than approximately 400 µm, since a sufficient current distribution is possible in this case by means of first contact regions arranged in the form of a contact grid.

In a second variant, the chip has a semiconductor body with a central perforation, in which the first contact region is arranged. This embodiment is suitable, in particular, for relatively small chips, preferably having an edge length of up to approximately 400 µm.

In accordance with one preferred embodiment, the chip is a thin-film light-emitting diode chip. A thin-film light-emitting diode chip is distinguished, in particular, by at least one of the following features:

a reflective layer is applied or formed at a first main area—facing towards a carrier element, of a radiation-generating epitaxial layer sequence, the reflective layer reflecting at least part of the electromagnetic radiation generated in the epitaxial layer sequence back into the latter;

the epitaxial layer sequence has a thickness in the range of 20 µm or less, in particular, in the range of 1 µm to 2 µm; and the epitaxial layer sequence contains at least one semiconductor layer having at least one area which has an intermixing structure which ideally leads to an approximately ergodic distribution of the light in the epitaxial layer sequence, that is to say that it has an as far as possible ergodically stochastic scattering behavior.

A basic principle of a thin-film light-emitting diode chip is described, for example, in I. Schnitzer, et al., Appl. Phys. Lett. 63 (16), 18 Oct. 1993, 2174-2176, the disclosure content of which in this respect is hereby incorporated by reference.

A thin-film light-emitting diode chip is to a good approximation a Lambertian surface emitter and is therefore particularly well suited to application in a headlight.

The semiconductor body can have layers based on phosphide compound semiconductors.

In this context, "based on phosphide compound semiconductors" means that a component or part of a component designated in this way preferably comprises $Al_nGa_mIn_{1-n-m}P$ where $0 \leq n \leq 1$, $0 \leq m \leq 1$ and $n+m \leq 1$. In this case, this material need not necessarily have a mathematically exact composition according to the above formula. Rather, it can have one or more dopants and additional constituents which essentially do not change the physical properties of the material. For the sake of simplicity, however, the above formula only comprises the essential constituents of the crystal lattice (Al, Ga, In, P), even if these can be replaced in part by small quantities of further substances.

As an alternative, the semiconductor body can have layers based on nitride compound semiconductors.

In the present context, "based on nitride compound semiconductors" means that the active epitaxial layer sequence or at least one layer thereof comprises a nitride III-V compound semiconductor material, preferably $Al_nGa_mIn_{1-n-m}N$ where $0 \leq n \leq 1$, $0 \leq m \leq 1$ and $n+m \leq 1$. In this case, this material need not necessarily have a mathematically exact composition according to the above formula. Rather, it can have one or more dopants and additional constituents which essentially do not change the characteristic physical properties of the $Al_nGa_mIn_{1-n-m}N$ material. For the sake of simplicity, however, the above formula only comprises the essential constituents of the crystal lattice (Al, Ga, In, N), even if these can be replaced in part by small quantities of further substances.

The epitaxial layer sequence of the thin-film light-emitting diode chip can have a thickness that is less than 1 µm, particularly when a material based on nitride compound semiconductors is used.

It is advantageous that in the chip described in the present case, no current spreading layer is required in the semiconductor body. This is because a sufficient current spreading is possible by means of the first contact layer. Therefore, the epitaxial layer sequence can be formed with a thickness of at most 2 µm.

Further improvements in the radiation intensity of the chip can be obtained by virtue of the fact that that surface of the semiconductor body which is arranged on the radiation exit side has coupling-out elements. By way of example, the surface can be roughened or have microprisms or a photonic crystal.

BRIEF DESCRIPTION OF THE DRAWINGS

The invention is explained in more detail below on the basis of five exemplary embodiments in connection with FIGS. 1 to 5.

Identical or identically acting elements are provided with the same reference symbols in the figures.

DETAILED DESCRIPTION OF ILLUSTRATIVE EMBODIMENTS

Figure 1:
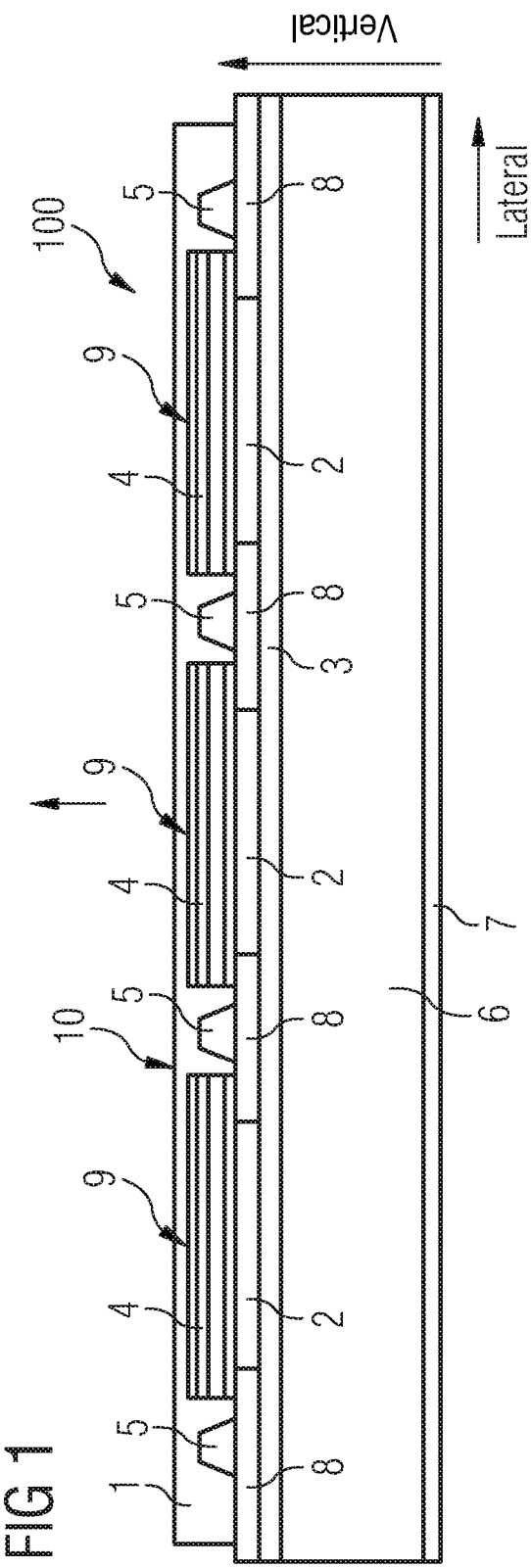
FIG. 1 shows a schematic illustration of a cross section through a first exemplary embodiment of a chip according to the invention.

The schematic illustration in FIG. 1 shows a cross section through a chip 100, wherein the sectional plane runs parallel to a side area of the chip 100. The chip 100 comprises separate semiconductor bodies 4 arranged regularly on a carrier 6. The semiconductor bodies 4 preferably form a matrix pattern, which in this case comprises three rows and three columns. Subdivision into a plurality of semiconductor bodies 4 is appropriate, in particular, in the case of relatively large chips having an edge length of preferably greater than approximately 400 µm. This is because, in this configuration, an advantageously homogeneous current distribution in the chip 100 is possible by means of a plurality of first contact regions 5.

Each semiconductor body 4 is arranged between two first contact regions 5. In particular, the first contact regions 5 are contact fingers extending linearly along the columns and rows in which the semiconductor bodies 4 are arranged. Thus, the first contact regions 5 form a contact grid that provides for an advantageous current distribution in the chip 100. The first contact regions 5 are preferably formed in metallic fashion, wherein a metal having an advantageous electrical conductivity and an advantageous reflectance, for example, Au, is suitable. Alongside the electrical supply, the first contact regions 5 are suitable for the reflection of impinging radiation. In particular, the impinging radiation is deflected in a main radiating direction, which is indicated by an arrow in FIG. 1. This can be achieved by means of obliquely running side areas of the first contact regions 5. As shown in FIG. 1, the cross-sectional form of the first contact regions 5 can be a trapezium.

The semiconductor bodies 4 and the first contact regions 5 are embedded into a first contact layer 1. The first contact layer 1 is electrically conductive and transmissive to the radiation emitted by the active regions of the semiconductor bodies 4. Materials suitable for the first contact layer 1 are TCOs, for example. Since the first contact layer 1 completely covers a surface 9 of the semiconductor bodies 4 which is situated on a radiation exit side 10 of the chip 100 and, moreover, no contact structures which absorb the radiation are situated on the surface 9, the semiconductor bodies 4 are electrically connected without shading of the surface 9. Although side areas of the semiconductor bodies 4 are covered by the first contact layer 1, there is no need to fear a short circuit since the lateral contact is sufficiently poor for operation of the semiconductor bodies 4.

The first contact regions 5 are arranged on an insulating layer 8, which electrically insulates the first contact regions 5 from a second contact region 3. Furthermore, the first contact layer 1 is electrically insulated from a second contact layer 2 by means of the insulating layer 8. The insulating layer 8 contains silicon nitride or silicon oxide, for example, and, in the present exemplary embodiment is structured in such a way that regions between the semiconductor bodies 4 and the second contact region 3 are essentially free of the insulating layer 8. The second contact layer 2 is arranged in the regions, the semiconductor bodies 4 being electrically and mechanically connected to the second contact region 3 by means of the second contact layer 2. Preferably, the second contact layer 2 is transmissive to the radiation generated by the semiconductor bodies 4 and particularly preferably contains a TCO. With this property, the second contact layer 2 together with the second contact region 3 forms, in particular, a mirror, such that the impinging radiation is reflected with high probability in the main emission direction.

The second contact region 3 completely covers a surface of the carrier 6 which faces the semiconductor bodies 4. Preferably, the second contact region 3 contains a metal or a metal compound, for example, Au, Al, Ag or AuZn.

In the case illustrated, the chip 100 can be electrically connected by means of a rear side contact 7. In this case, the carrier 6 contains an electrically conductive material, for instance a metal or a semiconductor.

The semiconductor bodies 4 are thin-film semiconductor bodies in which the growth substrate has been stripped away completely or apart from a few residues. Consequently, the semiconductor bodies 4 have a radiation-emitting region and also n-conducting and p-conducting cladding layers which are part of an epitaxial layer sequence 12 or form the epitaxial layer sequence 12. The thickness of the epitaxial layer sequence 12 is at most 2 µm, wherein the thickness can be kept so small because, on account of the first contact layer 1, a current spreading layer is not needed in the semiconductor bodies 4.

Figure 2:
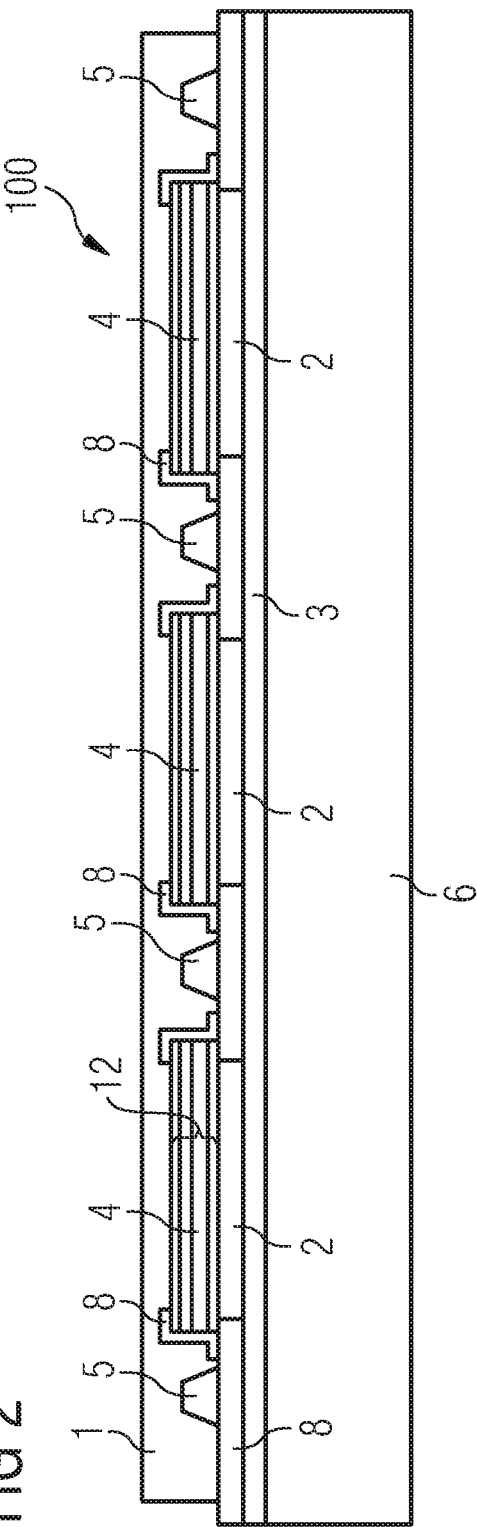
FIG. 2 shows a schematic illustration of a cross section through a second exemplary embodiment of a chip according to the invention.

In the case of the chip 100 illustrated in FIG. 2, the semiconductor bodies 4 are embedded into TCO. The first contact layer 1 and the second contact layer 2, which together enclose the semiconductor bodies 4, are electrically insulated from one another by the insulating layer 8.

In this exemplary embodiment, the side areas of the semiconductor bodies 4 are not covered by the first contact layer 1, but rather by the insulating layer 8. Consequently, the lateral contact is advantageously interrupted.

The semiconductor bodies 4 are arranged on the carrier 6, which is electrically non-conductive. By way of example, the carrier 6 can contain a ceramic material having a comparatively high thermal conductivity for cooling the chip 100. On the carrier side, the electrical connection is then not realized by means of a rear side contact, but rather preferably by means of an electrically conductive contact finger which is arranged in the same plane as the second contact region 3 and is electrically connected thereto.

A respective bonding wire can be bonded onto the first contact region 5 and the contact finger connected to the second contact region 3, wherein the bonding wires are connected to different poles of a power supply.

Figure 3:
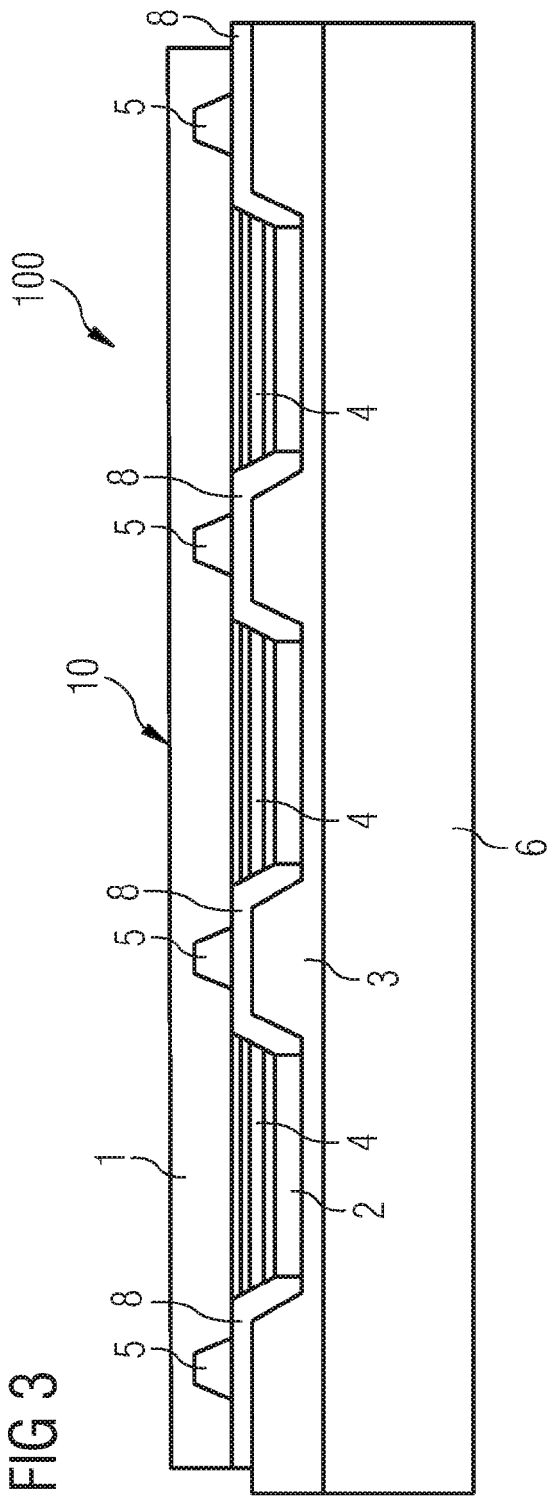
FIG. 3 shows a schematic illustration of a cross section through a third exemplary embodiment of a chip according to the invention.

While the second contact region 3 in the exemplary embodiments of FIGS. 1 and 2 is a layer of uniform thickness applied to the surface of the carrier 6, the second contact region 3 of the chip 100 illustrated in FIG. 3 has depressions and elevations. The side areas of the elevations, which simultaneously form the side areas of the depressions, run obliquely. In particular, the elevations are formed in the form of microprisms which advantageously improve the coupling out of radiation. The semiconductor bodies 4 are incorporated into the depressions, wherein a direct contact between the semiconductor bodies 4 and the second contact region 3 is prevented by the insulating layer 8. The insulating layer 8 coats the elevations and leaves the bottom of the depressions uncovered. The cavity which arises as a result between the semiconductor bodies 4 and the second contact region 3 is filled by the second contact layer 2.

The first contact regions 5 are disposed downstream of the elevations in a vertical direction. The first contact regions 5 are embedded into the first contact layer 1, wherein the first contact layer 1 is a layer which outwardly delimits the chip 100.

Figure 4:
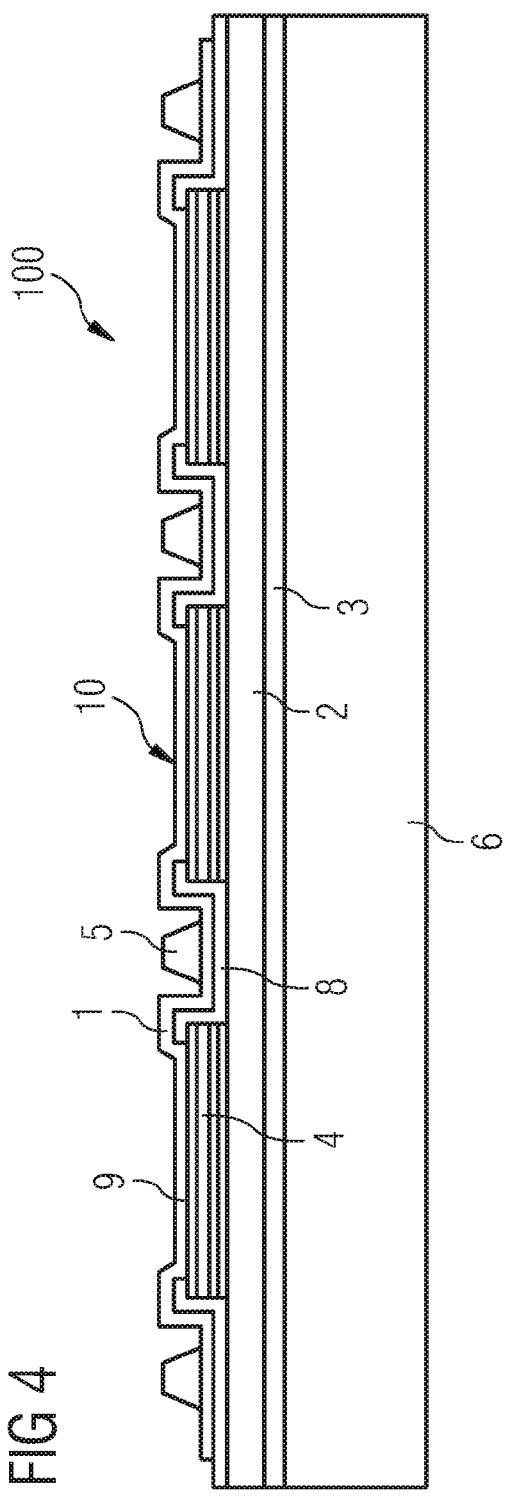
FIG. 4 shows a schematic illustration of a cross section through a fourth exemplary embodiment of a chip according to the invention.

In the case of the exemplary embodiment illustrated in FIG. 4, both the second contact region 3 and the second contact layer 2 are unstructured layers. In contrast to the exemplary embodiments illustrated in FIGS. 1 to 3, therefore, the mirror formed by the second contact region 3 and the second contact layer 2 is likewise unstructured. In this configuration, the production cost is advantageously reduced because the structuring step is obviated.

The semiconductor bodies 4 are arranged on the second contact layer 2 of uniform thickness. The insulating layer 8 coats the second contact layer 2 and the semiconductor bodies 4 and is interrupted only at the surface 9, such that the surface 9 can be almost completely covered by the first contact layer 1. In the trenches present between the semiconductor bodies 4 and likewise at the edge, the first contact regions 5 are applied to the first contact layer 1. Although the first contact layer 1 does not form a covering layer in this exemplary embodiment, the chip 100 nevertheless has no protruding elements on the radiation exit side 10. This can be achieved by sinking the first contact regions 5 into the trenches.

Figure 5:
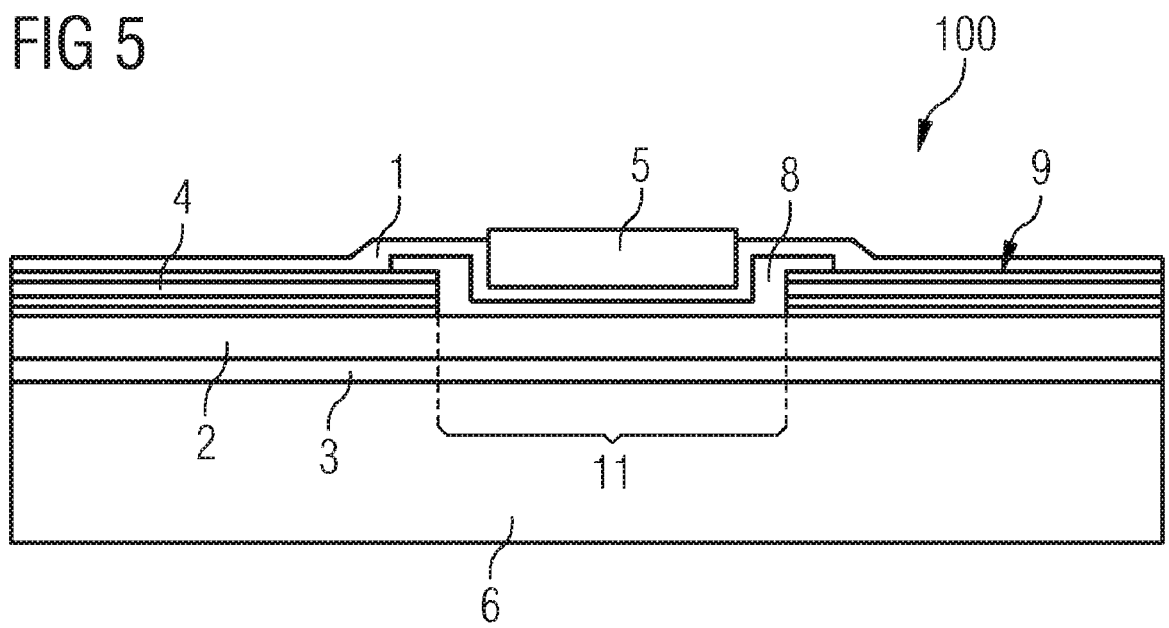
FIG. 5 shows a schematic illustration of a cross section through a fifth exemplary embodiment of a chip according to the invention.

FIG. 5 shows a variant of a chip 100 which differs from the exemplary embodiments illustrated in FIGS. 1 to 4 by virtue of its size. The design is suitable for relatively small chips, in particular, having an edge length of less than 400 µm. The chip 100 comprises an integral semiconductor body 4 having a perforation 11. The perforation 11 is advantageously arranged centrally, such that an isotropic energization of the semiconductor body 4 is possible by means of the first contact region 5 arranged within the perforation 11. In the same way as in the previous exemplary embodiments, no semiconductor layers suitable for radiation emission are situated below the first contact region 5, such that the first contact region 5 is not arranged in the main beam path of the chip 100 and, consequently, no shading occurs. Furthermore, no significant reduction of radiation need be feared as a result of the first contact region 5 since, by means of the contact region 5 an impinging light beam is either deflected in the main emission direction or reflected back into the semiconductor body 4, from where the light beam can be coupled out anew.

The perforation 11 is lined by the insulating layer 8, wherein the insulating layer 8 extends as far as the surface 9 of the semiconductor body 4. However, the surface 9 is covered for the most part by the first contact layer 1. Furthermore, the first contact layer 1 covers the insulating layer 8 and envelops a lower part of the first contact region 5.

The invention is not restricted by the description on the basis of the exemplary embodiments. Rather, the invention encompasses any new feature and also any combination of features, which, in particular, comprises any combination of features in the patent claims, even if this feature or this combination itself is not explicitly specified in the patent claims or exemplary embodiments.

The invention claimed is:

1. A chip comprising:
    at least one semiconductor body having a radiation-emitting region;
    at least one first contact region which is provided for making electrical contact with the at least one semiconductor body and is spaced apart laterally from the radiation-emitting region;
    an electrically conductive first contact layer, which is transmissive to emitted radiation and which connects a surface of the at least one semiconductor body that is situated on a radiation exit side of the chip to the at least one first contact region, the surface being free of radiation-absorbing contact structures; and
    a second contact layer that connects the at least one semiconductor body to a second contact region for making electrical contact with the at least one semiconductor body, wherein the second contact layer contains a TCO.

2. The chip according to claim 1, wherein the first contact layer on the radiation exit side is free of the radiation-absorbing contact structures.

3. The chip according to claim 1, wherein the at least one first contact region is spatially separated from the radiation-emitting region.

4. The chip according to claim 1, wherein the surface is covered for the most part by the first contact layer.

5. The chip according to claim 1, wherein the first contact layer forms a layer which outwardly delimits the chip in a main emission direction.

6. The chip according to claim 1, wherein the first contact layer contains a TCO.

7. The chip according to claim 1, wherein the at least one first contact region is a bonding pad or contact finger.

8. The chip according to claim 1, wherein the at least one first contact region comprises a metallic contact region.

9. The chip according to claim 1, wherein the at least one first contact region and the at least one semiconductor body are arranged on a common carrier.

10. The chip according to claim 9, wherein the second contact region is applied to the common carrier.

11. The chip according to claim 10, wherein the at least one first contact region is disposed downstream of the second contact region in a vertical direction proceeding from the common carrier.

12. The chip according to claim 1, wherein the second contact region comprises a metallic contact region.

13. The chip according to claim 12, wherein the second contact region comprises a reflection layer.

14. The chip according to claim 13, wherein the second contact layer is arranged between the at least one semiconductor body and the second contact region and, together with the second contact region, forms a mirror.

15. The chip according to claim 1, wherein the second contact layer is transmissive to the emitted radiation.

16. The chip according to claim 1, further comprising an insulating layer arranged between the at least one first contact region and the second contact region.

17. The chip according to claim 1, wherein the chip has a first and a second semiconductor body, which are spaced apart laterally and between which a first contact region is arranged.

18. The chip according to claim 1, wherein the at least one semiconductor body has a central perforation, in which the at least one first contact region is arranged.

19. The chip according to claim 1, wherein the chip is a thin-film light-emitting diode chip.

20. The chip according to claim 19, wherein an epitaxial layer sequence of the thin-film light-emitting diode chip has a thickness of at most 2 μm.

21. A chip comprising:
at least one semiconductor body having a radiation-emitting region;
at least one first contact region which is provided for making electrical contact with the at least one semiconductor body and is spaced apart laterally from the radiation-emitting region;
an electrically conductive first contact layer, which is transmissive to emitted radiation and which connects a surface of the at least one semiconductor body that is situated on a radiation exit side of the chip to the at least one first contact region, the surface being free of radiation-absorbing contact structures, wherein the at least one first contact region and the at least one semiconductor body are arranged on a common carrier; and
a second contact layer that connects the at least one semiconductor body to a second contact region for making electrical contact with the at least one semiconductor body, the second contact region being applied to the common carrier,
wherein the at least one first contact region is disposed downstream of the second contact region in a vertical direction proceeding from the common carrier.

22. A chip comprising:
at least one semiconductor body having a radiation-emitting region;
at least one first contact region which is provided for making electrical contact with the at least one semiconductor body and is spaced apart laterally from the radiation-emitting region;
an electrically conductive first contact layer, which is transmissive to emitted radiation and which connects a surface of the at least one semiconductor body that is situated on a radiation exit side of the chip to the at least one first contact region, the surface being free from radiation-absorbing contact structures; and
a second contact layer that connects the at least one semiconductor body to a second contact region for making electrical contact with the at least one semiconductor body, wherein the second contact layer is transmissive to the emitted radiation.

* * * * *